(12) United States Patent
Suzuki

(10) Patent No.: US 8,791,563 B2
(45) Date of Patent: Jul. 29, 2014

(54) SEMICONDUCTOR DEVICE AND MANUFACTURING METHOD THEREOF

(71) Applicant: Fuji Electric Co., Ltd, Kawasaki (JP)

(72) Inventor: Kenji Suzuki, Azumino (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/788,578

(22) Filed: Mar. 7, 2013

(65) Prior Publication Data
US 2013/0234312 A1    Sep. 12, 2013

(30) Foreign Application Priority Data
Mar. 9, 2012    (JP) .................................. 2012-053329

(51) Int. Cl.
*H01L 23/00*    (2006.01)

(52) U.S. Cl.
USPC ........... 257/698; 257/678; 257/687; 257/690; 257/712; 257/713

(58) Field of Classification Search
CPC ..... H01L 23/02; H01L 23/043; H01L 23/051; H01L 23/10; H01L 23/16; H01L 23/18; H01L 24/46; H01L 24/85
USPC ......... 257/678, 687, 690, 698, 712, 713, 723; 361/600, 601, 611
See application file for complete search history.

(56) References Cited

U.S. PATENT DOCUMENTS

| | | | | |
|---|---|---|---|---|
| 4,458,305 | A * | 7/1984 | Buckle et al. | 363/141 |
| 5,621,243 | A * | 4/1997 | Baba et al. | 257/712 |
| 7,149,088 | B2 * | 12/2006 | Lin et al. | 361/704 |

FOREIGN PATENT DOCUMENTS

| | | |
|---|---|---|
| JP | 08-148645 A | 6/1996 |
| JP | 2009-141000 A | 6/2009 |
| JP | 2010-103343 A | 5/2010 |

\* cited by examiner

*Primary Examiner* — Peniel M Gumedzoe
(74) *Attorney, Agent, or Firm* — Manabu Kanesaka

(57) ABSTRACT

Terminal assembly portions, lying on a front surface side of a case, are aligned in a left-right direction in a portion raised from a bottom of the case so that opening faces of the terminal assembly portions are positioned above circuit formation regions. Wiring terminal plates are led out into the terminal assembly portions, and disposed adjacent to each other. After each wiring terminal plate is connected by a laser welding to one end of one external connection terminal plate formed integrally with a cover, these welded portions are sealed with a second mold resin portion made of gel or an insulating resin such as epoxy. By so doing, even when the terminal junction area and distance between terminal junctions in the terminal assembly portions are small, it is possible to increase the joint strength of the terminals, and also secure withstand voltage.

9 Claims, 4 Drawing Sheets

SEMICONDUCTOR DEVICE AND MANUFACTURING METHOD THEREOF

BACKGROUND OF THE INVENTION

1. Technical Field

The present invention relates to a semiconductor device having, in a case, a circuit formation region including a plurality of semiconductor elements, and to a method of manufacturing the semiconductor device, and particularly, relates to a semiconductor device wherein a plurality of semiconductor elements is electrically connected from wiring terminal plates embedded in the case through external connection terminal plates to external terminals formed on an outer peripheral portion of the case, and to a method of manufacturing the semiconductor device.

2. Related Art

In recent years, a reduction in size and weight of an inverter circuit which converts high electric power using a plurality of semiconductor elements such as insulated gate bipolar transistors (IGBTs) has been attempted. There is a description of a semiconductor device, such as a power module using a common IGBT module, in JP-A-08-148645 (for example, refer to paragraph number [0003] and FIG. 1).

That is, firstly, semiconductor chips such as IGBTs or diode chips are connected by a solder or the like to copper patterns formed on an insulating substrate, and furthermore, the insulating substrate is connected to a cooling base plate. Subsequently, a predetermined case is mounted around the cooling base plate, and electrodes of the semiconductor chips and the copper patterns on the insulating substrate are connected to metal terminal plates incorporated in the case by bonding aluminum wires in order to make an electrical connection between the metal terminal plates and the electrodes and copper patterns. An outer enclosing case, made of a thermoplastic resin, which encloses the insulating substrate is fixed to the cooling base plate with an adhesive, and furthermore, in order to protect the semiconductor chips and the bonded aluminum wires, an insulating material such as gel or epoxy resin is injected into the case, and hardened. Finally, external connection terminal plates are connected to the metal terminal plates incorporated in the case and external terminals by a laser welding, or the like, in order to make a connection between the metal terminal plates and external terminals.

Also, JP-A-2009-141000 (for example, refer to paragraph numbers [0024] to [0042] and FIG. 1) discloses a semiconductor device having a plurality of semiconductor elements encompassed by a resin case, wherein the disposition of wiring terminals can be easily changed. The semiconductor device includes a plurality of external connection terminals fixed and supported in the resin case, at least one semiconductor element encompassed in the resin case, and at least one terminal block on which is disposed at least one wiring terminal which electrically connects the semiconductor element and external connection terminal. With the semiconductor device, as the external connection terminals fixed in the resin case and metal foils are electrically connected through the terminal blocks, it is possible to easily implement a routing of the wiring terminals in the resin case. Also, even in the event that the external connection terminals are fixed and supported in the resin case, it is possible to freely change the disposition of the wiring terminals routed from the external connection terminals by preparing in advance some kinds of terminal block with the wiring terminals changed in wiring pattern.

Furthermore, a semiconductor device in JP-A-2010-103343 (for example, refer to paragraph numbers [0009] to [0037] and FIGS. 1 and 2) includes a resin case, semiconductor elements housed in the resin case, a printed circuit board, housed in the resin case, which includes control units controlling actions of the semiconductor elements, and a cover portion which covers the semiconductor elements and printed circuit board housed in the resin case, wherein an outer periphery of the printed circuit board is sandwiched by the resin case and cover portion. With this kind of configuration, it is possible to form a highly reliable semiconductor device having sufficient resistance to a vibration from outside and a cold and hot cycle.

Patent Document 1: Japanese Unexamined Patent Publication No. H08-148645
Patent Document 2: Japanese Unexamined Patent Publication No. 2009-141000
Patent Document 3: Japanese Unexamined Patent Publication No. 2010-1003343

With the configuration of a heretofore known semiconductor device, it is desired that the size of a case is reduced, and at the same time that the shape and size of the case, the positions of external terminals, and the like, can be freely determined in accordance with a demand from a user. In this case, it is not preferable from, the standpoint of the semiconductor device design to eject external connection terminals directly from semiconductor chips sealed inside the case.

Therefore, as shown in the heretofore described JP-A-2009-141000, a configuration wherein the semiconductor elements are electrically connected via internal connection wiring terminals to the external connection terminals disposed on an outer peripheral portion of the case is adopted. However, in a semiconductor device requiring a plurality of external connection terminals as in an IGBT module, the terminals must be spaced at a certain distance apart from each other in order to ensure insulation between the terminals. For this reason, in a semiconductor device with a configuration wherein a plurality of internal wiring terminal plates is connected to the external connection terminals inside a case, there has been a need to increase the size of the case itself to a certain degree.

In response to this, it is possible to reduce the size of the case by the internal wiring terminal plates being led outside the case in advance, and the internal wiring terminal plates and external connection terminals being rigidly connected outside the case by a laser welding. However, when the connections of the internal wiring terminal plates are exposed outside the case, the connections are likely to deteriorate in joint strength. For this reason, a heretofore known arrangement has been such that the joint strength is secured by increasing the welding area of laser welded portions, and at the same time, the connections are also prevented from deteriorating due to heat generated in semiconductor chips. Also, in order to maintain the insulation between the wiring terminal plates led outside the case, the junctions of the wiring terminal plates must be widely spaced apart from each other.

SUMMARY OF THE INVENTION

The invention, having in mind these kinds of points, has an object of providing a semiconductor device, and a manufacturing method thereof, with which it is possible to secure joint strength and withstand voltage, and at the same time, reduce the external dimensions of the device.

The invention provides a semiconductor device having in a case a circuit formation region including a plurality of semiconductor elements. The semiconductor device includes a plurality of wiring terminal plates each, of which is electrically connected to one of the plurality of semiconductor elements; a terminal assembly portion in which the plurality of wiring terminal plates led out from the circuit formation region is assembled; a plurality of external connection terminal plates, one end of each of which is connected to one of the plurality of wiring terminal plates in the terminal assembly portion, and the other ends of which are extended to external terminal portions disposed on the case; and a mold resin portion which insulates and protects connections of the wiring terminal plates and external connection terminal plates with a resin with which the terminal assembly portion is filled.

Also, a semiconductor device manufacturing method of the invention manufactures a semiconductor having in a case a circuit formation region including a plurality of semiconductor elements. The semiconductor device manufacturing method includes a step of soldering semiconductor elements to an insulating substrate forming the circuit formation region; a step of mounting over the insulating substrate a case having integrally a plurality of wiring terminal plates, mutually adjacent terminal assembly portions disposed in an outer surface of the case, and external terminal portions, in predetermined positions on an outer peripheral portion of the case; a wire bonding step which electrically connects the semiconductor elements and the wiring terminal plates; a first sealing step which insulates and seals wires and semiconductor elements in the circuit formation region with a mold resin; a step of covering the circuit formation region in the case with a cover body integrally formed with external connection terminal plates formed to extend to the external terminal portions; and a second sealing step which connects the external connection terminal plates to the wiring terminal plates in the terminal assembly portions, and insulates and seals the connections with a mold resin.

According to the invention, it is possible to secure the joint strength of the junctions of the wiring terminals and the withstand voltage between the external connection terminals, and at the same time, reduce the external dimensions of the semiconductor device.

DETAILED DESCRIPTION OF THE EMBODIMENTS

Figure 1:
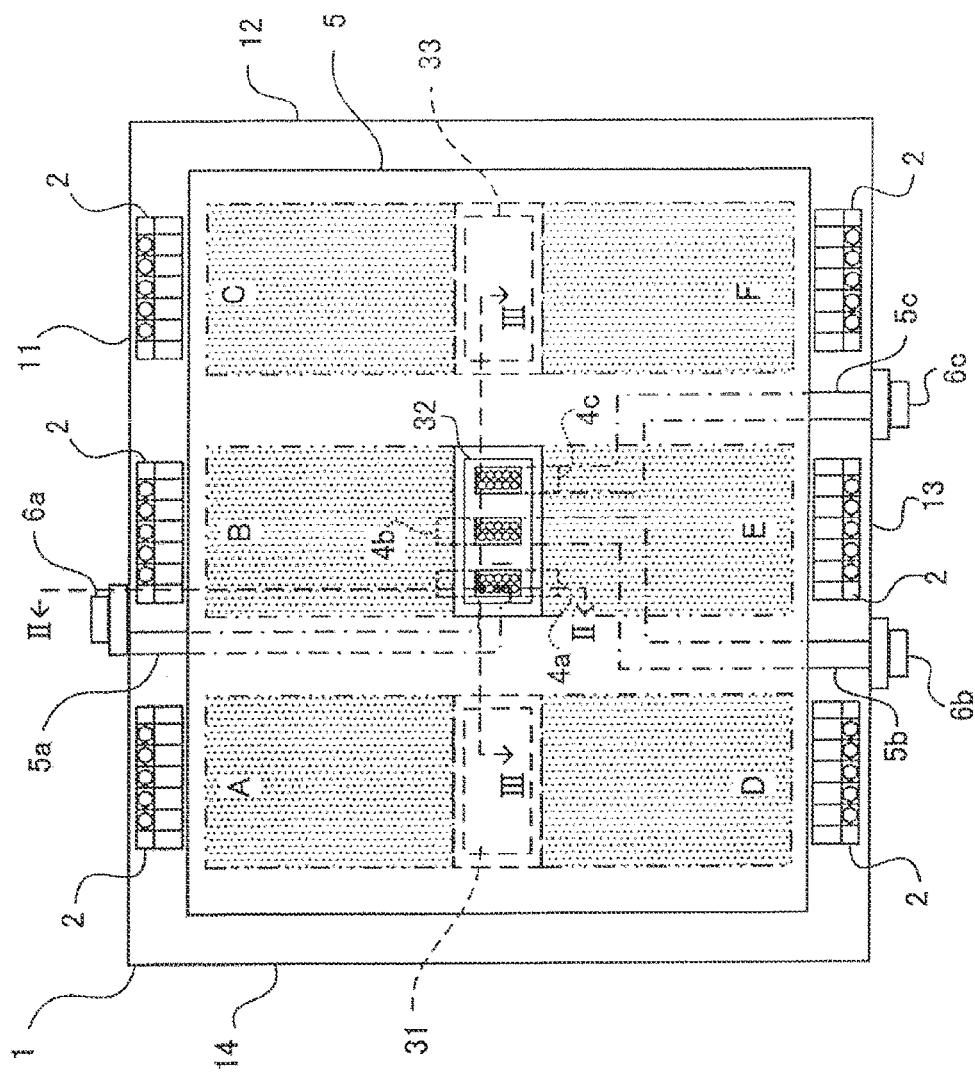
FIG. 1 is a top plan view showing a semiconductor device according to an embodiment of the invention.

Hereafter, referring to the drawings, a description will be made to an embodiment of the invention. FIG. 1 is a top plan view showing a semiconductor device according to the embodiment of the invention.

The semiconductor device has circuit, formation regions A to F, shown by the two-dot chain lines,, disposed by dividing the inside of a rectangular case 1 into, for example, six regions, and an inverter circuit configured by a semiconductor element, such as an IGBT, is disposed in each of the circuit formation regions A to F. A pair of inverter circuits is formed for each pair of circuit formation regions A and D, B and E, and C and F in the case 1.

Control terminals 2 are terminals through, which control signals are supplied to the inverter circuits in the circuit formation regions A to F, and are embedded in corresponding front-back direction outer peripheral sidewalls 11 and 13 of the case 1 adjacent to their respective circuit formation regions A to C and D to F. The case 1 further includes left-right direction outer peripheral, sidewalls 12 and 14, and the outer shape of the case 1 is substantially a rectangular parallelepiped. Terminal assembly portions 31 to 33 are formed in a portion, raised from a bottom of the case 1, in a middle portion inside the case 1 between the circuit formation regions A to C and D to F, and the opening faces of the terminal assembly portions 31 to 33 are disposed to align in a left-right direction as seen from the top side of the case 1. In addition, in these terminal assembly portions 31 to 33, the terminal assembly portion 32 is formed in a position equidistant from the two adjacent circuit formation regions B and E, and wiring terminal plates 4a, 4b, and 4c led out from the corresponding circuit formation regions B and E are disposed in the terminal assembly portion 32 so as to be adjacent to each other.

Also, the terminal assembly portion 31 is formed in a position equidistant from the two adjacent circuit formation regions A and D, and in the same way, the terminal assembly portion 33 is formed in a position equidistant from the two adjacent circuit formation regions C and F, wherein the same wiring terminal plates 4a, 4b, and 4c are also disposed in each of the terminal assembly portions 31 and 33. In FIG. 1, only the shapes of the terminal assembly portion 32 and wiring terminal plates 4a, 4b, and 4c led out thereinto are illustrated, and only the outer shapes of the terminal assembly portions 31 and 33 are shown by the broken lines, while the illustration of the wiring terminal plates 4a, 4b, and 4c corresponding to the terminal assembly portions 31 and 33 is omitted.

In this way, one end of each of the wiring terminal plates 4a, 4b, and 4c electrically connected to the semiconductor element formed in each circuit formation region A to F is led out to an outer surface of the case 1 in each terminal assembly portion 31 to 33. By covering opening portions of the case 1 above the circuit formation regions A to F with a cover 5, portions of the circuit formation regions A to F in the case 1 other than the terminal assembly portions 31 to 33 are eventually all shielded from the exterior. External connection terminal plates 5a, 5b, and 5c shown by the chain lines in FIG. 1 are embedded integrally in the cover 5. That is, by the cover 5 placed on the case 1, the external connection terminal plates 5a, 5b, and 5c are connected to the three wiring terminal plates 4a, 4b, and 4c led out from the corresponding circuit formation regions B and E into the terminal assembly portion 32.

One end of the external connection terminal plate 5a is connected by a plurality, for example, ten as shown in FIG. 1, of laser welds Lb to the wiring terminal plate 4a, of the wiring terminal plates 4a, 4b, and 4c, led out from the circuit formation regions B and E into the terminal assembly portion 32. Further, the other end of the external connection terminal plate 5a configures an external terminal portion 6a on the outer peripheral portion of the front direction sidewall 11 of the case 1. Also, one end of the external connection terminal plate 5b is connected by the laser welds Lb to the wiring terminal plate 4b led out from the circuit formation region B into the terminal assembly portion 32. Further, the other end of the external connection terminal plate 5b is extended in the back direction of the case 1 via a portion between the circuit formation regions D and E, configuring an external terminal portion 6b on the outer peripheral portion of the sidewall 13. In the same way, one end of the external connection terminal plate 5c is connected by the laser welds Lb to the wiring terminal plate 4c led out from the circuit formation region E into the terminal assembly portion 32. Further, the other end of the external connection terminal plate 5c is extended in the back direction of the case 1 via a portion between the circuit formation regions E and F, configuring an external terminal portion 6c on the outer peripheral portion of the sidewall 13.

Only the external connection terminal plates 5a, 5b, and 5c corresponding to the terminal assembly portion 32 are shown here in FIG. 1, but in the terminal assembly portions 31 and 33 too, external connection terminals corresponding thereto are formed integrally with the cover 5, and insulated from one another.

Next, a description will be made to a semiconductor circuit housed inside the case 1 of the semiconductor device.

Figure 2:
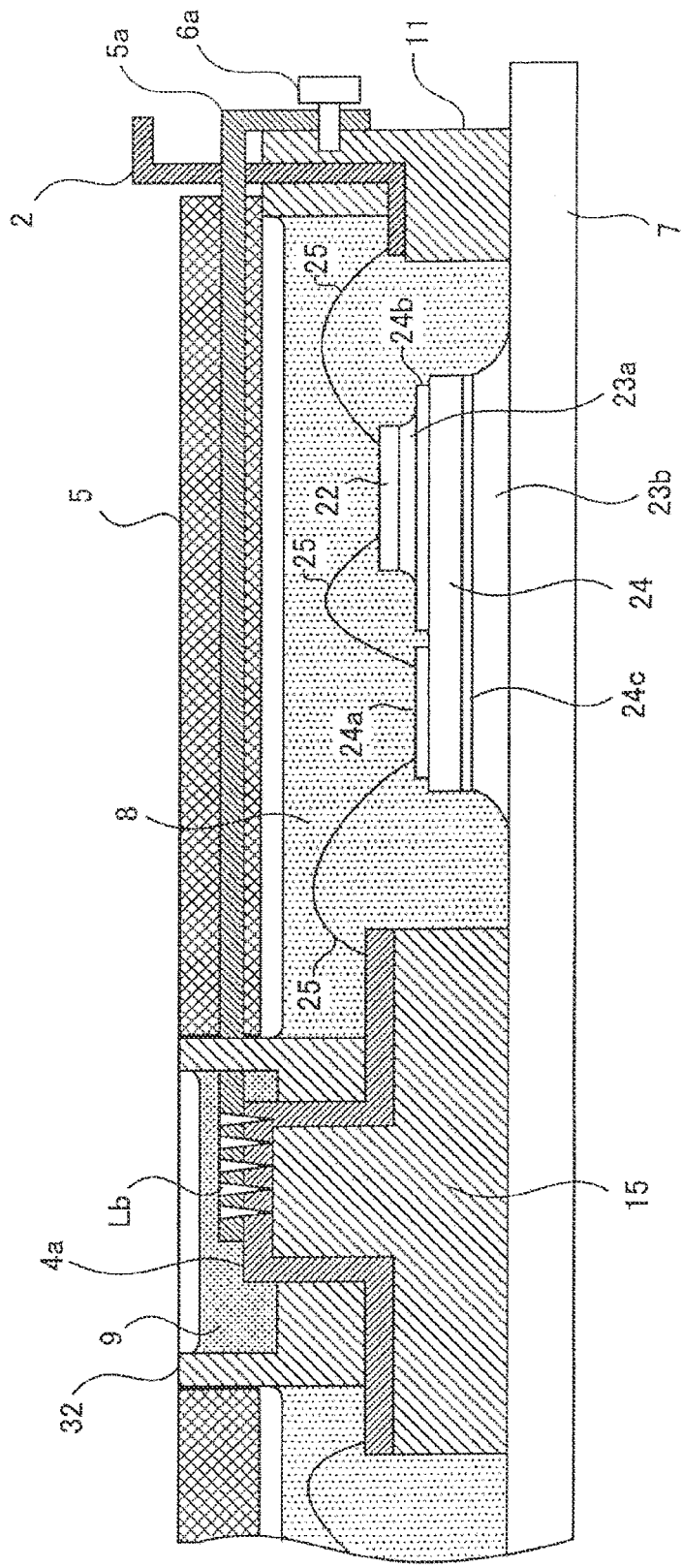
FIG. 2 is a sectional view taken along a section II-II of the semiconductor device in FIG. 1.
Figure 3:
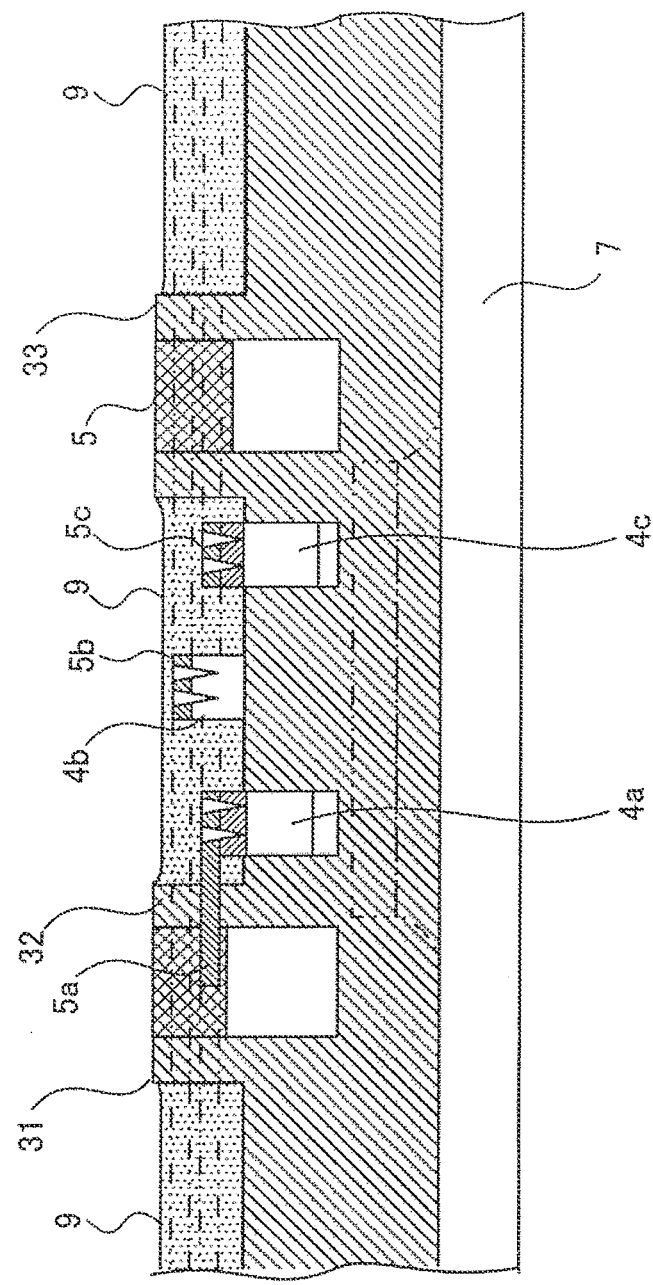
FIG. 3 is a sectional view taken along a section III-III of the semiconductor device in FIG. 1.

FIG. 2 is a sectional view taken along the section II-II of the semiconductor device in FIG. 1, and FIG. 3 is a sectional view taken along the section III-III of the semiconductor device in FIG. 1.

A semiconductor chip 22 is joined to one side of an insulating substrate 24 by a solder 23a. Conductive layers 24a, 24b and 24c are joined to each corresponding surface of the insulating substrate 24, and a copper plate or the like configuring a cooling base plate 7 for use in heat release is joined to the side opposite the semiconductor chip 22 by a solder 23b. The case 1 is fixed to the cooling base plate 7 by an adhesive so as to surround the insulating substrate 24, and metal plates such as the previously described wiring terminal plates 4a, 4b, and 4c and control terminals 2 are incorporated in the case 1.

One electrode of the semiconductor chip 22 and the conductive layer 24a of the insulating substrate 24 are connected by an aluminum wire 25 or the like, a control electrode of the semiconductor chip 22 and the control terminal 2 are connected by an aluminum wire 25 or the like, and furthermore, the conductive layer 24a and wiring terminal plate 4a are connected by an aluminum wire 25 or the like. In this way, the bottom of the case 1 is configured by the cooling base plate 7, and a plurality of semiconductor elements is disposed, on an upper surface of the bottom as the circuit formation region B. Only a configuration of the inverter circuit formed in the circuit formation region B, relating to a specific semiconductor element such as an IGBT, is shown in FIG. 2.

Subsequently, each of the circuit formation regions A to C of the case 1 is sealed with a first mold resin portion 8 made of gel or an insulating resin such as epoxy. The gel or insulating resin such as epoxy cast into the inside of the case 1 hardens, thereby protecting internal structures of semiconductor chips, aluminum wires and the like.

Next, upon topping the top of the case 1 with the cover 5, one end of each of the external connection terminal plates 5a to 5c and the like formed integrally with the cover 5 comes into contact with their respective wiring terminal plates 4a to 4c in the terminal assembly portion 32. That is, as previously described, the terminal assembly portions 31 to 33, lying on the front surface side of the case 1, are formed on the top side of a raised portion 15 highly raised from the bottom of the case 1, and peripheral wall portions of the terminal assembly portions 31 to 33 are configured so as to be flush with the upper surface of the cover 5.

At this time, the wiring terminal plates 4a to 4c in the terminal assembly portion 32 shown in FIG. 3 are such that the connections thereof are embedded in the raised portion 15 of the case 1 at differing heights so that the corresponding external connection terminal plates 5a, 5b, and 5c can be connected to the wiring terminal plates 4a to 4c in height direction positions differing from each other. In the sectional view in FIG. 3, the wiring terminal plates 4a to 4c and the like in the terminal assembly portions 31 and 33 adjacent to the terminal assembly portion 32 are omitted.

In this way, the wiring terminal plates 4a to 4c to which the external connection terminal plates 5a to 5c are connected can be spaced at a sufficient insulation distance apart from each other by being distanced from each other in the height direction even when the wiring terminal plates 4a to 4c are set to be close to each other in the left-right direction in the terminal assembly portion 32. Consequently, as it is possible to secure the withstand voltage between terminals even when the area of the terminal assembly portions 31 to 33 formed in the case 1 is designed to be small, it is easy to reduce the size of the case 1 of the semiconductor device.

Also, the heretofore described semiconductor device is such that, in the single terminal assembly portion 32, the external connection terminal plates 5a to 5c are connected to the plurality of wiring terminal plates 4a to 4c, and the like, by a laser welding, and furthermore, these welded portions are sealed with a second mold resin portion 9 made of gel or an insulating resin such as epoxy. By so doing, it is possible to secure withstand voltage even when the wiring terminal plates 4a to 4c of the semiconductor device are close to each other.

Furthermore, as the welded portions are protected by the second mold resin portion 9, it is possible to secure a sufficient size of the mechanical strength of connection between the external connection terminal plates 5a, 5b, and 5c and the wiring terminal plates 4a, 4b, and 4c. As a resin provides one portion of the mechanical strength, it is possible to reduce a welding area necessary for the connection between the terminal plates, and thus possible to reduce the number of welding points of the laser welds Lb. Consequently, it is possible to reduce the size of the whole of the semiconductor device without reducing the strength of connection between the external terminal portions 6a, 6b, and 6c connected to an external electronic device and the semiconductor chip 22 electrically connected via the wiring terminal plates 4a to 4c.

In the heretofore described example of the semiconductor device, an arrangement is such that a space portion having an opening on its top side is formed in the raised portion 15 of the case 1, and an insulating resin forming the second mold resin portion 9 is cast into the space portion, but an arrangement may be such that an opening portion is provided in the cover 5, and an insulating resin forming the second mold resin portion 9 is cast into the opening portion.

Also, in the heretofore described example, an arrangement is such that one end of each of the external connection terminal plates 5a, 5b, and 5c is connected to their respective wiring terminal plates 4a, 4b, and 4c by the laser welds Lb, but an arrangement may be such that the number of wiring terminal plates housed in a terminal assembly portion is at least one, and a first external connection terminal plate is connected to a first wiring terminal plate. Also, an arrangement may be such that the number of wiring terminal plates is at least two, and a first external connection terminal plate and second external connection terminal plate are connected to a first wiring terminal plate and second wiring terminal plate respectively. Furthermore, an arrangement may be such that a substantially central portion, instead of one end, of an external connection terminal plate is connected to a wiring terminal plate, and each end of the external connection terminal plate is disposed on a sidewall of the case. When the number of wiring terminal plates housed in a terminal assembly portion is one or two, too, the joint strength of junctions and the withstand voltage between external connection terminals are secured by an insulating resin.

Figure 4:
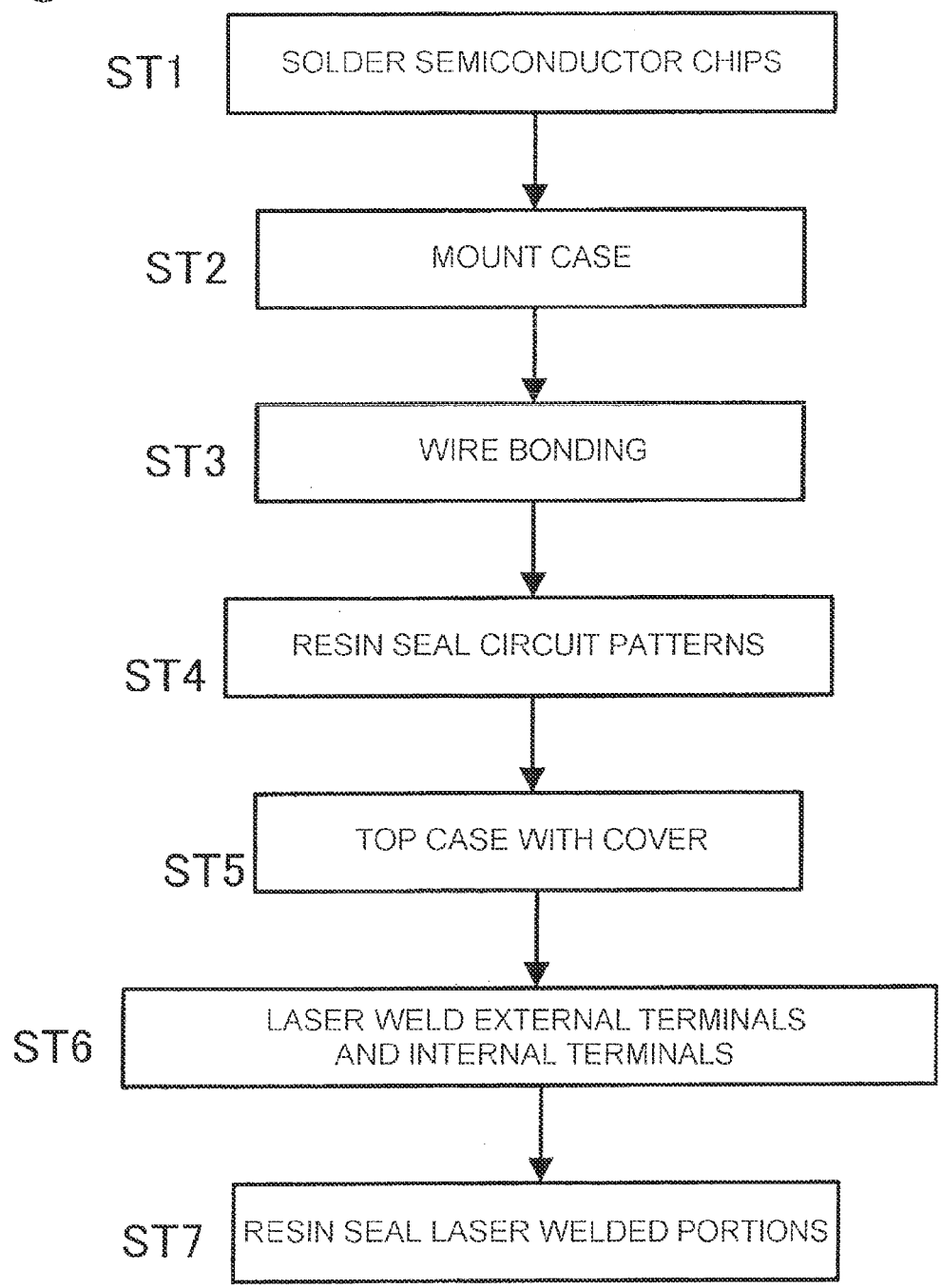
FIG. 4 is a diagram showing a process of manufacturing the semiconductor device of the invention.

FIG. 4 is a diagram showing a process of manufacturing the semiconductor device of the invention.

In step ST1, the semiconductor chip 22 is soldered to the conductive layer 24b and the like on each insulating substrate 24, thereby configuring the plurality of circuit formation regions A to F forming the inverter circuits. At this time, the insulating substrates 24 may be disposed on and soldered to the cooling base plate 7.

In step ST2, the case 1 having configured integrally with the plurality of wiring terminal plates 4a, 4b, and 4c, the terminal assembly portions 31 to 33 disposed in the outer surface so as to be close to each other, and the external terminal portions 6a, 6b, and 6c in predetermined positions on the outer peripheral portion, is prepared and mounted over the insulating substrates 24 (refer to FIGS. 1 and 2). At this time, the cooling base plate 7 acting as a heat releasing metal plate for releasing heat generated in the semiconductor chips 22 disposed in the circuit formation regions A to F to the exterior is used as a bottom plate of the case 1. An arrangement may be such that the case 1 is fixed to the cooling base plate 7 using, for example, an adhesive.

In step ST3, one electrode of the semiconductor chip 22 and the conductive layer 24a of the insulating substrate 24 are connected by the aluminum wire 25 or the like, the control electrode of the semiconductor chip 22 and the control terminal 2 are connected by the aluminum wire 25 or the like, and furthermore, the conductive layer 24a and the wiring terminal plate 4a are connected by the aluminum wire 25 or the like (refer to FIG. 2).

In step ST4, the aluminum wires 25, semiconductor chips 22, and the like in the circuit formation regions A to F are insulated and sealed with a mold resin (a first sealing step).

In step ST5, the top of the case 1 is covered with the cover 5. By so doing, the circuit formation regions A to F in the case 1 are covered, and the external terminal portions 6a, 6b, and 6c disposed to be dispersed on the outer peripheral portion of the case 1 and the wiring terminal plates 4a to 4c disposed in the terminal assembly portions 31 to 33 come into contact via the external connection terminal plates 5a, 5b, and 5c formed integrally with the cover 5.

In step ST6, the external connection terminal plates 5a, 5b, and 5c are connected by a laser welding to the connections thereof with the wiring terminal plates 4a to 4c (refer to FIGS. 2 and 3).

In step ST7, the laser welded connections in the terminal assembly portions 31 to 33 are insulated and sealed with a mold resin (a second sealing step).

The heretofore described manufacturing process is one example wherein the external connection terminal plates 5a to 5c are configured integrally with the cover 5 covering the circuit formation regions A to F, but the invention is not limited to this. For example, when the external connection terminal plates 5a to 5c are prepared separately from the cover 5, the whole of the case 1 can also be covered with the cover after the second sealing step (step ST7) by omitting step ST5 which tops the top of the case 1 with the cover 5.

The disclosure of Japanese Patent Application No. 2012-053329 filed on Mar. 9, 2012 is incorporated herein as a reference.

What is claimed is:

1. A semiconductor device comprising:
   a case;
   a circuit formation region disposed in the case and including a plurality of semiconductor elements;
   a plurality of wiring terminal plates, each of which is electrically connected to one of the plurality of semiconductor elements;
   a terminal assembly portion where the plurality of wiring terminal plates led out from the circuit formation region is gathered;
   a plurality of external connection terminal plates, each having one end connected to one of the plurality of wiring terminal plates in the terminal assembly portion, and another end extended to external terminal portions disposed on the case; and
   a mold resin portion which insulates and protects connections of the wiring terminal plates and external connection terminal plates with a resin with which the terminal assembly portion is filled.

2. The semiconductor device according to claim 1, wherein the external terminal portions are disposed to be spread, on an outer peripheral portion of the case.

3. The semiconductor device according to claim 1, wherein the plurality of wiring terminal plates has connections for connecting with the external connection terminal plates, different in height in the terminal assembly portion.

4. The semiconductor device according to claim 1, wherein the plurality of wiring terminal plates is each integrally formed with the case.

5. The semiconductor device according to claim 1, wherein the terminal assembly portion is formed on a front surface side of the case, and an opening face of the terminal assembly portion is positioned above the circuit formation region.

6. The semiconductor device according to claim 1, wherein the circuit formation region is divided into a plurality of regions in the case, and the terminal assembly portion in which the plurality of wiring terminal plates led out from the corresponding circuit formation regions is assembled is formed in a position equidistant from the circuit formation regions.

7. The semiconductor device according to claim 1, wherein the external connection terminal plates are formed integrally with a cover portion covering the circuit formation region.

8. The semiconductor device according to claim 1, wherein the external connection terminal plates are connected to the wiring terminal plates by a laser welding in the terminal assembly portion.

9. The semiconductor device according to claim 1, wherein the case includes as a bottom plate thereof a heat releasing metal plate for releasing heat generated in the semiconductor elements disposed in the circuit formation region to the exterior.

* * * * *

UNITED STATES PATENT AND TRADEMARK OFFICE
CERTIFICATE OF CORRECTION

PATENT NO.       : 8,791,563 B2                                    Page 1 of 1
APPLICATION NO.  : 13/788578
DATED            : July 29, 2014
INVENTOR(S)      : Kenji Suzuki It is certified that error appears in the above-identified patent and that said Letters Patent is hereby corrected as shown below:

In the Specification

Please change column 2, line 66, from "... plurality of wiring terminal plates each, of which is electrically..." to -- plurality of wiring terminal plates each of which is electrically --.

In the Claims

Please change claim 2 from "2. The semiconductor device according to claim 1, wherein the external terminal portions are disposed to be spread, on an outer peripheral portion of the case." to -- 2. The semiconductor device according to claim 1, wherein the external terminal portions are disposed to be spread on an outer peripheral portion of the case. --.

Signed and Sealed this
Eighteenth Day of November, 2014

Michelle K. Lee
*Deputy Director of the United States Patent and Trademark Office*

UNITED STATES PATENT AND TRADEMARK OFFICE
CERTIFICATE OF CORRECTION

| | |
|---|---|
| PATENT NO. | : 8,791,563 B2 |
| APPLICATION NO. | : 13/788578 |
| DATED | : July 29, 2014 |
| INVENTOR(S) | : Kenji Suzuki |

Page 1 of 1

It is certified that error appears in the above-identified patent and that said Letters Patent is hereby corrected as shown below:

In the Specification

Please change column 2, line 66, from "... plurality of wiring terminal plates each, of which is electrically..." to -- plurality of wiring terminal plates each of which is electrically --.

In the Claims

Please change column 8, lines 24-26, claim 2 from "2. The semiconductor device according to claim 1, wherein the external terminal portions are disposed to be spread, on an outer peripheral portion of the case." to -- 2. The semiconductor device according to claim 1, wherein the external terminal portions are disposed to be spread on an outer peripheral portion of the case. --.

This certificate supersedes the Certificate of Correction issued November 18, 2014.

Signed and Sealed this
Sixteenth Day of December, 2014

Michelle K. Lee
*Deputy Director of the United States Patent and Trademark Office*